(12) United States Patent
Su et al.

(10) Patent No.: US 8,232,119 B2
(45) Date of Patent: Jul. 31, 2012

(54) METHOD FOR MANUFACTURING HEAT DISSIPATION BULK OF SEMICONDUCTOR DEVICE

(75) Inventors: Yan-Kuin Su, Tainan (TW);
Kuan-Chun Chen, Taichung (TW);
Chun-Liang Lin, Tainan (TW)

(73) Assignee: National Cheng Kung University, Tainan (TW)

( * ) Notice: Subject to any disclaimer, the term of this patent is extended or adjusted under 35 U.S.C. 154(b) by 19 days.

(21) Appl. No.: 13/031,736

(22) Filed: Feb. 22, 2011

(65) Prior Publication Data
US 2012/0149138 A1    Jun. 14, 2012

(30) Foreign Application Priority Data
Dec. 10, 2010   (TW) ............................... 99143290 A (51) Int. Cl.
*H01L 21/00* (2006.01)
(52) U.S. Cl. ......................................... 438/26; 438/108
(58) Field of Classification Search .............. 438/26–28, 438/107–108
See application file for complete search history.

(56) References Cited

U.S. PATENT DOCUMENTS

| | | | |
|---|---|---|---|
| 6,724,791 B1 | 4/2004 | Chiappetta et al. | |
| 6,933,176 B1 * | 8/2005 | Kirloskar et al. | 438/122 |
| 7,002,257 B2 * | 2/2006 | Tao et al. | 257/787 |
| 7,239,022 B2 * | 7/2007 | Ikezawa et al. | 257/777 |
| 7,368,322 B2 * | 5/2008 | Reiss et al. | 438/118 |
| 2003/0045015 A1 | 3/2003 | Slater et al. | |
| 2004/0084760 A1 * | 5/2004 | Liu et al. | 257/686 |
| 2007/0102809 A1 | 5/2007 | Dubin | |
| 2008/0067669 A1 | 3/2008 | Buttel | |

* cited by examiner

*Primary Examiner* — Richard A. Booth
(74) *Attorney, Agent, or Firm* — Thomas, Kayden, Horstemeyer & Risley, LLP (57) ABSTRACT

A method for manufacturing a heat dissipation bulk of a semiconductor device including the following steps is described. An electrically conductive layer is formed to cover a surface of a temporary substrate. At least one semiconductor chip is connected to the electrically conductive layer by at least one metal bump, wherein the at least one metal bump is located between the at least one semiconductor chip and the electrically conductive layer. A metal substrate is formed on the electrically conductive layer, wherein the metal substrate fills up a gap between the at least one semiconductor chip and the electrically conductive layer. The temporary substrate is removed.

12 Claims, 7 Drawing Sheets

METHOD FOR MANUFACTURING HEAT DISSIPATION BULK OF SEMICONDUCTOR DEVICE

RELATED APPLICATIONS

This application claims priority to Taiwan Application Serial Number 099143290, filed Dec. 10, 2010, which is herein incorporated by reference.

FIELD OF THE INVENTION

The present invention relates to a method for manufacturing a semiconductor device, and more particularly to a method for manufacturing a heat dissipation bulk of a semiconductor device.

BACKGROUND OF THE INVENTION

Packaging techniques for semiconductor devices, such as transistors, integrated circuits, or optoelectronic devices including light-emitting diodes (LEDs) and laser diodes (LDs), include using glue or solder paste to connect semiconductor chips and package substrates while flip-chip techniques are performed by using metal bumps to connect semiconductor chips and package substrates.

However, in the process of fixing the semiconductor chips with glue and solder paste or in the flip-chip package processes, the process temperature has to be increased to above 150 degrees Celsius. During the thermal connection processes at such a temperature, the electricity properties of the semiconductor devices are easily damaged.

In addition, when the semiconductor optoelectronic devices are applied in a large or small backlight module or illumination module, the semiconductor optoelectronic devices need to provide sufficient light export flux to generate sufficient brightness and illumination for the modules. Therefore, these semiconductor optoelectronic devices usually have to be operated at high input power. However, the high input power causes an abrupt increase of the temperature of the semiconductor optoelectronic devices, thereby degrading the operational efficiency of the semiconductor optoelectronic devices, and even burning the semiconductor optoelectronic devices due to the high temperature.

Currently, in order to resolve the poor heat-dissipating efficiency issue of the semiconductor illumination module, the module is typically cooled by fans set in the module or by increasing the heat dissipation area. However, these techniques cause many problems. For example, regarding setting fans in the module, the vibration caused by the operation of the fans results in the lights flickering, and the fans consume additional power. Regarding increasing the heat dissipation area, the cost of the heat dissipation material of the larger semiconductor illumination module is greatly increased. In addition, although the heat dissipation bulk can be composed of metal with high thermal conductivity, such as Al or Cu, for achieving the effect of rapidly transmitting heat, glue is used to connect the semiconductor illumination device and the heat dissipation bulk, and the thermal conductivity of the glue is much lower than that of the pure metal. As a result, the heat generated during the operation of the device mostly accumulates at the connection interface, thereby making the heat dissipation bulk less effective.

Another technique is provided. In the technique, a front side of a semiconductor device is firstly pressed into an adhesive tape, and a metal reflective thin film and a metal heat dissipation bulk are plated on a rear side of the semiconductor device. However, the inventors discover that when a large adhesive tape is adhered with a large semiconductor device, air bubbles are easily formed at the adhesive interface. As a result, the metal reflective thin film and the metal heat dissipation bulk plated on the adhesive tape are non-uniform. In addition, during the metal plating process, it is very easy for the adhesive tape to expand with heat and contract with cold. Therefore, the metal reflective thin film on the adhesive tape cracks very easily, thereby greatly reducing the yield.

SUMMARY OF THE INVENTION

Therefore, one aspect of the present invention is to provide a method for manufacturing a heat dissipation bulk of a semiconductor device, in which a metal bump may be used to connect a semiconductor chip and an electrically conductive layer on a temporary substrate. Therefore, the heat dissipation bulk can be formed on a bottom of the semiconductor device without glue. Accordingly, the semiconductor device directly and closely contacts with the heat dissipation bulk, so that the heat dissipation bulk can be more effective, thereby greatly increasing the heat-dissipating efficiency of the semiconductor device.

Another aspect of the present invention is to provide a method for manufacturing a heat dissipation bulk of a semiconductor device, in which the heat dissipation bulk is successfully formed on a bottom of the semiconductor device without using an adhesive tape. Therefore, the crack problem of a reflective layer due to the phenomenon of expanding with heat and contracting with cold of the adhesive tape in the prior art can be prevented, thereby effectively increasing the product yield.

Still another aspect of the present invention is to provide a method for manufacturing a heat dissipation bulk of a semiconductor device, in which the non-uniformity problem of the thickness of a metal reflective thin film and a metal heat dissipation bulk resulting from the adhering difficulty between an adhesive tape and the semiconductor device in the prior art can be prevented. Therefore, with the application of the present invention, the process of fabricating the heat dissipation bulk is simple and is easily implemented, and the quality of the heat dissipation bulk can be enhanced.

Further another aspect of the present invention is to provide a method for manufacturing a heat dissipation bulk of a semiconductor device, which can directly connect the heat dissipation bulk to a bottom of the semiconductor device. Therefore, the heat generated during the operation of the semiconductor device can be rapidly transmitted through the heat dissipation bulk to rapidly lower the temperature of the semiconductor device, thereby enhancing the operation quality of the semiconductor device and effectively prolonging the life of the semiconductor device.

According to the aforementioned objectives, the present invention provides a method for manufacturing a heat dissipation bulk of a semiconductor device, including the following steps. An electrically conductive layer is formed to cover a surface of a temporary substrate. At least one semiconductor chip is connected to the electrically conductive layer by at least one metal bump, wherein the at least one metal bump is located between the at least one semiconductor chip and the electrically conductive layer. A metal substrate is formed on the electrically conductive layer, wherein the metal substrate fills up a gap between the at least one semiconductor chip and the electrically conductive layer. The temporary substrate is removed.

According to an embodiment of the present invention, the at least one semiconductor chip is a semiconductor optoelectronic device. Between the step of forming the metal substrate and the step of removing the temporary substrate, the method further includes: forming a reflective layer on the metal substrate; and forming a transparent protection layer on the reflective layer. According to another embodiment of the present invention, the step of forming the reflective layer includes using a plating method or an electroless plating method.

According to still another embodiment of the present invention, the electrically conductive layer includes a metal layer or a transparent conductive layer, wherein a material of the metal layer may include, for example, Au, Al, Ag and Pt, and a material of the transparent conductive layer may include, for example, ITO.

According to yet another embodiment of the present invention, a bottom of the at least one semiconductor chip is set with a metal adhesion layer.

According to further another embodiment of the present invention, the step of connecting the least one semiconductor chip to the electrically conductive layer by the at least one metal bump may include, for example, using an ultrasonic thermal-pressing connection method.

According to still further another embodiment of the present invention, the step of forming the metal substrate may include, for example, using a plating method or an electroless plating method.

With the application of the method of the present invention, a heat dissipation bulk directly connected to a bottom of a semiconductor device can be fabricated without glue or an adhesive tape. Therefore, the heat-dissipating ability of the heat dissipation bulk is effectively used and the heat-dissipating efficiency of the semiconductor device is greatly increased, thereby enhancing the operation quality of the semiconductor device and effectively prolonging the life of the semiconductor device.

In addition, the present invention can prevent the crack problem of a reflective layer due to the phenomenon of expanding with heat and contracting with cold of an adhesive tape in the prior art, and the non-uniformity problem of the thickness of a metal reflective thin film and a metal heat dissipation bulk resulting from the adhering difficulty between the adhesive tape and a semiconductor device in the prior art. Therefore, the process of fabricating the heat dissipation bulk is simple and is easily implemented, and the quality of the heat dissipation bulk and the product yield can be effectively enhanced.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Refer to FIG. 1 through FIG. 8. FIG. 1 through FIG. 8 are schematic flow diagrams showing a method for manufacturing a heat dissipation bulk of a semiconductor device in accordance with an embodiment of the present invention. In the present embodiment, a temporary substrate 100 is firstly provided. The temporary substrate 100 is a carrier with a carrying function. In some exemplary embodiments, the temporary substrate 100 may be a flat substrate or a mold with any three-dimensional structure. A material of the temporary substrate 100 may be metal, nonmetal, or a compound consisting of metal and nonmetal. The material of the temporary substrate 100 preferably has an acid-proof and alkali-proof property.

Figure 1:
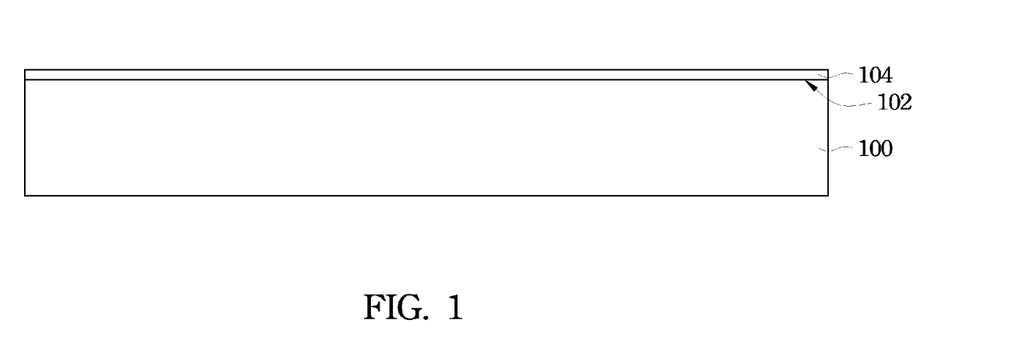
FIG. 1 through FIG. 8 are schematic flow diagrams showing a method for manufacturing a heat dissipation bulk of a semiconductor device in accordance with an embodiment of the present invention.

Then, as shown in FIG. 1, an electrically conductive layer 104 is formed to cover a surface 102 of the temporary substrate 100 by, for example, a deposition method. The method for depositing the electrically conductive layer 104 may be a plating method, a sputtering method, an evaporation method, an electroless plating method, a screen printing method, a so-gel method or a sintering method. In one exemplary embodiment, the electrically conductive layer 104 may be a metal layer, and a material of the metal layer may include, for example, Au, Al, Ag and Pt. In another exemplary embodiment, the electrically conductive layer 104 may be a transparent conductive layer, and a material of the transparent conductive layer may include, for example, ITO.

Next, one or more metal bumps can be used to connect the semiconductor chip and the electrically conductive layer 104 on the temporary substrate 100, so that the metal bumps are connected between the semiconductor chip and the electrically conductive layer 104. The metal bumps may be in any shapes, and the metal bumps may be metal bumps 106, 108, 110, 112, 114 and 116, for example. In addition, the metal bumps must be current conducting.

Figure 2:
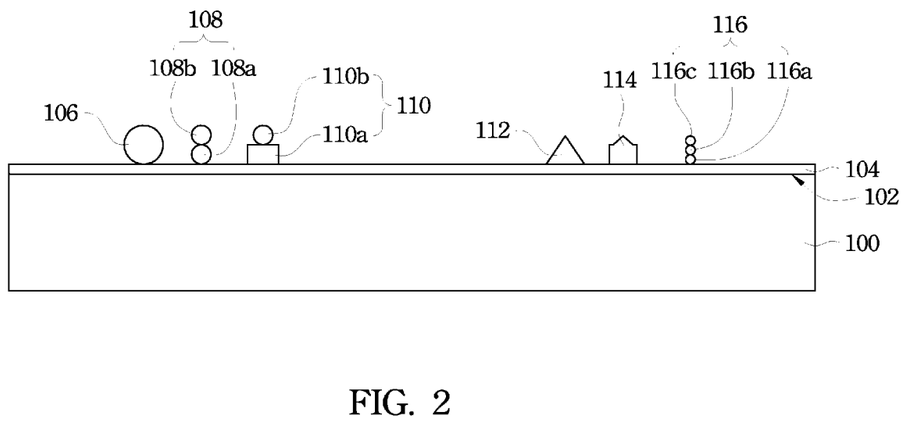

In one exemplary embodiment, as shown in FIG. 2, several metal bumps 106, 108, 110, 112, 114 and 116 may be provided, and these metal bumps 106, 108, 110, 112, 114 and 116 are firstly disposed and fixed onto the electrically conductive layer 104 by, for example, a thermal-pressing connection method. The thermal-pressing connection method may be an ultrasonic thermal-pressing connection method. In another exemplary embodiment, the metal bumps and the electrically conductive layer may be connected by simultaneously using ultrasonic waves and applying pressure. The metal bump may be a single structure, such as the metal bumps 106, 112 and 114 shown in FIG. 2. The metal bump may also be composed of multiple structures, such as the metal bumps 108, 110 and 116 shown in FIG. 2. The metal bump 108 is formed by stacking two bumps 108a and 108b, the metal bump 110 is formed by stacking two bumps 110a and 110b, and the metal bump 112 is formed by stacking three bumps 112a, 112b and 112c.

Figure 3:
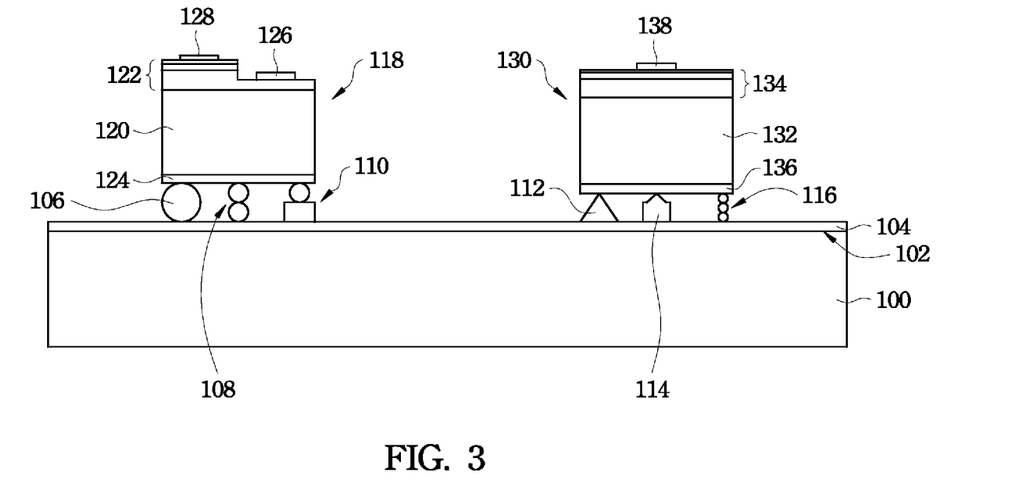

Next, as shown in FIG. 3, semiconductor chips 118 and 130 are respectively connected to the metal bumps 106, 108 and 110, and the metal bumps 112, 114 and 116 by, for example, a thermal-pressing method. The thermal-pressing method may be an ultrasonic thermal-pressing connection method, for example. In another exemplary embodiment, the semiconductor chips and the metal bumps may be connected by simultaneously using ultrasonic waves and applying pressure. In the present embodiment, each of the semiconductor chips 118 and 130 is connected to the electrically conductive layer 104 through three metal bumps. However, in other embodiments, each semiconductor chip can be connected to the electrically conductive layer 104 through a single metal bump merely, or through two or more metal bumps.

In another embodiment, the metal bumps 106, 108 and 110, and the metal bumps 112, 114 and 116 are firstly connected to the semiconductor chips 118 and 130 respectively by, for example, a thermal-pressing connection method; and then, the metal bumps 106, 108 and 110 connected to the semiconductor chip 118, and the metal bumps 112, 114 and 116 connected to the semiconductor chip 130 are connected to the electrically conductive layer 104 by, for example, a thermal-pressing connection method. The thermal-pressing connection method used in the present exemplary embodiment may be, for example, an ultrasonic thermal-pressing connection method. In another exemplary embodiment, the semiconductor chips and the electrically conductive layer may be connected by simultaneously using ultrasonic waves and applying pressure.

In still another embodiment, a semiconductor chip and the electrically conductive layer 104 may be connected by a metal bump composed of at least two bumps stacked with each other. For example, when the semiconductor chip and the electrically conductive layer 104 is connected by the metal bump 110 shown in FIG. 2, the bump 110a and 110b of the metal bump 110 are respectively connected to the electrically conductive layer 104 and the semiconductor chip 118 by, for example, a thermal-pressing connection method; and then, the bumps 110a and 110b respectively connected to the electrically conductive layer 104 and the semiconductor chip 118 are stacked and connected with each other by, for example, a thermal-pressing connection method. Similarly, the thermal-pressing connection method used in the present exemplary embodiment may be, for example, an ultrasonic thermal-pressing connection method. In another exemplary embodiment, the semiconductor chips and the electrically conductive layer may be connected by simultaneously using ultrasonic waves and applying pressure.

In the present invention, only one semiconductor chip is disposed on the electrically conductive layer 104. However, a plurality of semiconductor chips, such as the semiconductor chips 118 and 130, can be simultaneously disposed on the electrically conductive layer 104. In the present embodiment, the semiconductor chip may be a semiconductor device, such as a transistor and an integrated circuit, or a semiconductor optoelectronic device, such as a light-emitting diode, laser diode and a solar cell. In one exemplary embodiment, the semiconductor chips 118 and 130 may be bare chips, a module processed through a primary package, a module processed through a secondary package, or a module processed through a multiple package.

In one exemplary embodiment, as shown in FIG. 3, the semiconductor chips 118 and 130 may be light-emitting diodes. The semiconductor chip 118 includes a substrate 120, an illuminant epitaxial structure 122 disposed on the substrate 120, and a first electrode 126 and a second electrode 128 disposed on the illuminant epitaxial structure 122. The first electrode 126 and the second electrode 128 are of different conductivity types. For example, when one of the first electrode 126 and the second electrode 128 is n-type, the other one of the first electrode 126 and the second electrode 128 is p-type. A bottom of the semiconductor chip 118 may be further set with a metal adhesion layer 124, wherein the metal adhesion layer 124 has an electrically conductive property. The metal adhesion layer 124 preferably has good adhesion with the bottom of the semiconductor chip 118 and the metal bumps, such as metal bumps 106, 108 and 110 for facilitating the connection between the semiconductor chip 118 and the metal bumps 106, 108 and 110.

Similarly, the semiconductor chip 130 includes a substrate 132, an illuminant epitaxial structure 134 disposed on the substrate 132, a second electrode 138 disposed on the illuminant epitaxial structure 134, and a first electrode 136 disposed below the substrate 132. Similarly, the first electrode 136 and the second electrode 138 are of different conductivity types. For example, when one of the first electrode 136 and the second electrode 138 is n-type, the other one of the first electrode 136 and the second electrode 138 is p-type. In the semiconductor chip 130, the first electrode 136 can be used as a metal adhesion layer of the semiconductor chip 130. Therefore, the first electrode 136 preferably has good adhesion with the bottom of the semiconductor chip 130 and the metal bumps, such as metal bumps 112, 114 and 116.

As shown in FIG. 3, the two electrodes of the semiconductor chip, such as the first electrode 126 and the second electrode 128 of the semiconductor chip 118, can be disposed on the same side of the semiconductor chip; or, the two electrodes of the semiconductor chip, such as the first electrode 136 and the second electrode 138 of the semiconductor chip 130, can be disposed on opposite sides of the semiconductor chip.

Figure 4:
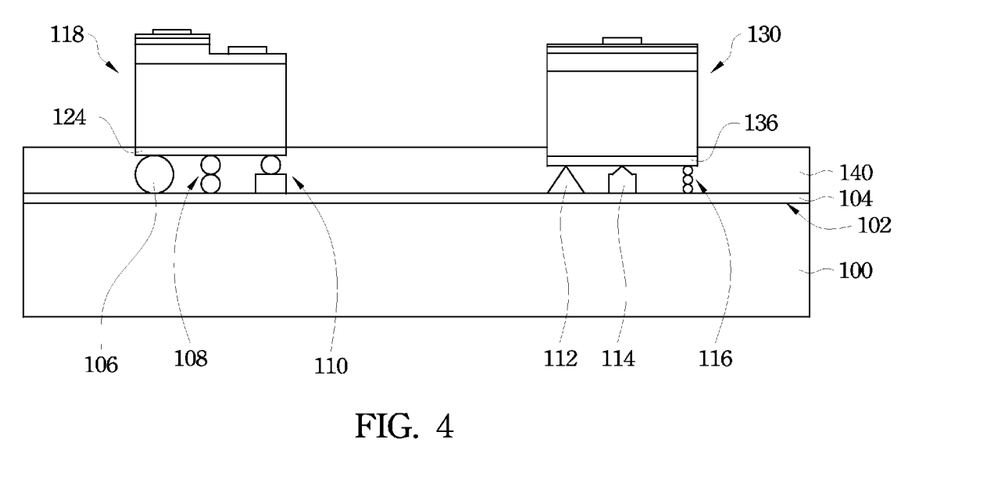

Next, as shown in FIG. 4, a metal substrate 140 is formed to cover the electrically conductive layer 104 and to fill up a gap between the semiconductor chips 118 and 130 and the electrically conductive layer 104 by, for example, a deposition method. The metal substrate 140 can cover a portion of a sidewall near the bottom of each of the semiconductor chips 118 and 130. The deposition method used to form the metal substrate 140 may be, for example, a plating method or an electroless plating method. In one exemplary embodiment, the metal substrate 140 may be composed of a single metal material. In another exemplary embodiment, the metal substrate 140 may be composed of multiple metal material layers. A material of the metal substrate 140 is preferably composed of a metal with a good heat-dissipating property, such as Cu, Fe/Ni alloy, Ni, Al, W, or alloys thereof.

Figure 5:
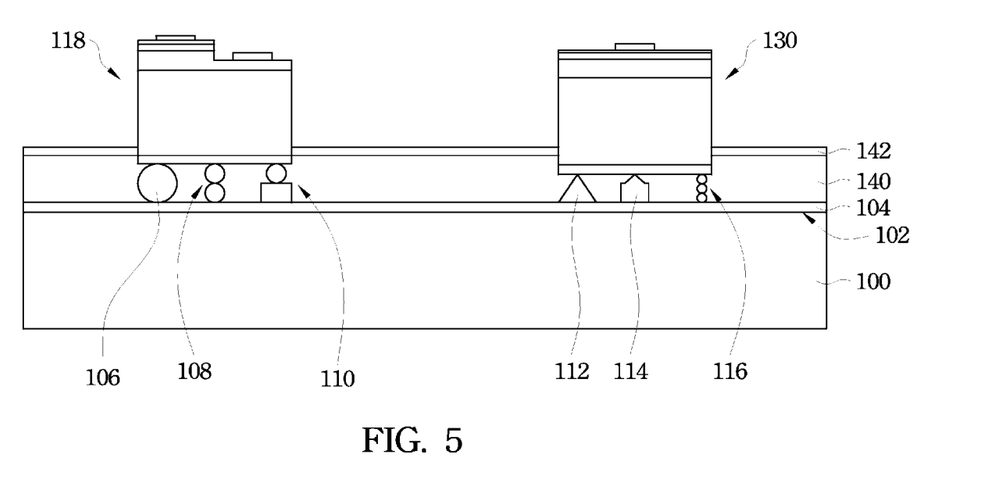

In one exemplary embodiment, as shown in FIG. 5, when the semiconductor chips 118 and 130 are semiconductor optoelectronic devices, a reflective layer 142 is selectively formed to cover the metal substrate 140 by, for example, a deposition method, for reflecting the light toward the bottoms of the semiconductor chips 118 and 130 emitted by the semiconductor chips 118 and 130. The deposition method used to form the reflective layer 142 may be, for example, a plating method or an electroless plating method. The reflective layer 142 preferably has good adhesion with the metal substrate 140. In one exemplary embodiment, the reflective layer 142 may be composed of one or more metal materials. In another exemplary embodiment, the reflective layer 142 may be composed of one or more nonmetal materials. In still another exemplary embodiment, the reflective layer 142 may be composed of one or more metal materials and one or more nonmetal materials.

Figure 6:
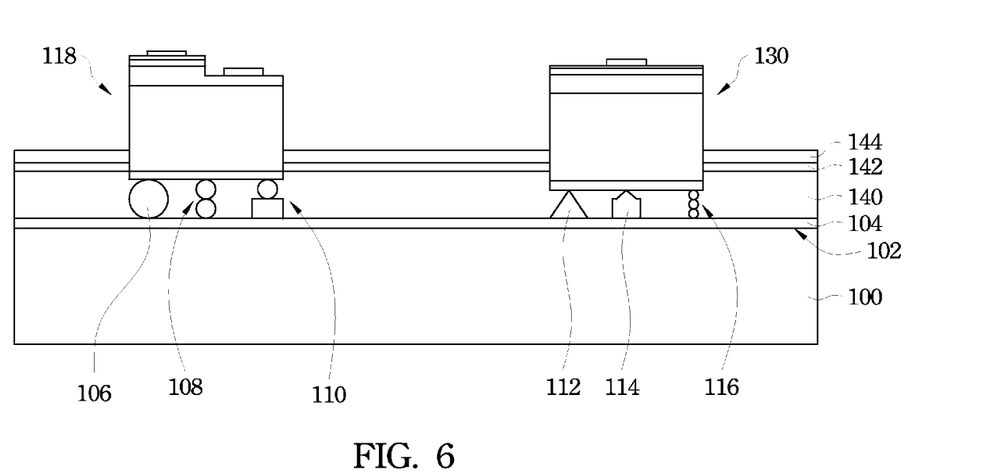

In the present embodiment, as shown in FIG. 6, after the reflective layer 142 is formed, a transparent protection layer 144 is formed to cover the reflective layer 142 by, for example, a deposition method, for protecting the reflective layer 142 and preventing the material of the reflective layer 142 from being oxidized and degraded. The transparent protection layer 144 preferably has a high penetration rate for being successfully penetrated by the light.

Figure 7:
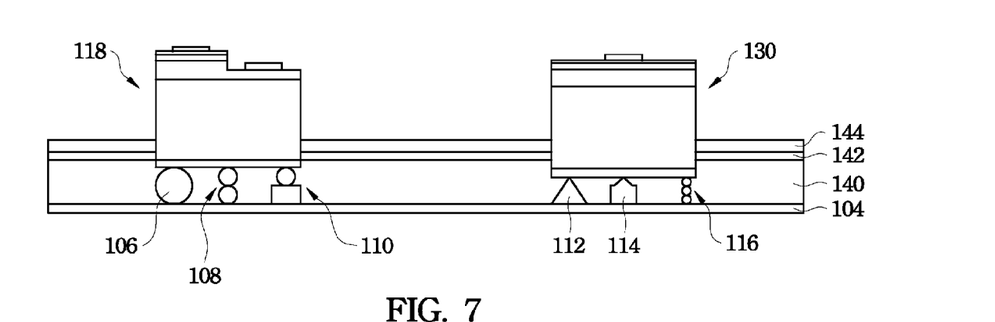
Figure 8:
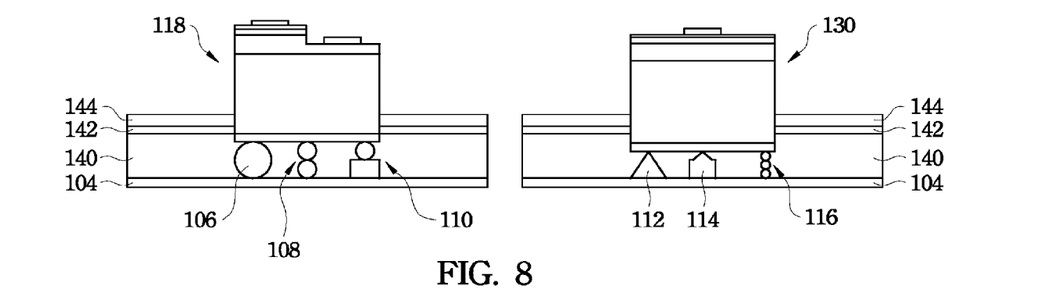

Subsequently, as shown in FIG. 7, the temporary substrate 100 is removed to expose the electrically conductive layer 104 by, for example, a polishing method or a laser stripping method. Next, when a plurality of semiconductor chips, such as the semiconductor chips 118 and 130, are disposed on the electrically conductive layer 104, the semiconductor chips 118 and 130 may be separated by cutting. Then, the fabrication of the metal substrates, i.e. heat dissipation bulks, of the semiconductor chips 118 and 130 is completed, as shown in FIG. 8.

According to the aforementioned embodiments, one advantage of the present invention is that a metal bump may be used to connect a semiconductor chip and an electrically conductive layer on a temporary substrate, so that a heat dissipation bulk can be formed on a bottom of a semiconductor device without glue. Accordingly, the semiconductor device directly and closely contacts with the heat dissipation bulk, so that the heat dissipation bulk can be more effective, thereby greatly increasing the heat-dissipating efficiency of the semiconductor device.

According to the aforementioned embodiments, another advantage of the present invention is that a heat dissipation bulk is successfully formed on a bottom of a semiconductor device without using an adhesive tape. Therefore, the crack problem of a reflective layer due to the phenomenon of expanding with heat and contracting with cold of the adhesive tape in the prior art can be prevented, thereby effectively increasing the product yield.

According to the aforementioned embodiments, still another advantage of the present invention is that the non-uniformity problem of the thickness of a metal reflective thin film and a metal heat dissipation bulk resulting from the adhering difficulty between an adhesive tape and a semiconductor device in the prior art can be prevented. Therefore, with the application of the present invention, the process of fabricating the heat dissipation bulk is simple and is easily implemented, and the quality of the heat dissipation bulk can be enhanced.

According to the aforementioned embodiments, further another advantage of the present invention is that a heat dissipation bulk can be directly connected to a bottom of a semiconductor device. Therefore, the heat generated during the operation of the semiconductor device can be rapidly transmitted through the heat dissipation bulk to rapidly lower the temperature of the semiconductor device, thereby enhancing the operation quality of the semiconductor device and effectively prolonging the life of the semiconductor device.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a heat dissipation bulk of a semiconductor device, including:
   forming an electrically conductive layer to cover a surface of a temporary substrate;
   connecting at least one semiconductor chip to the electrically conductive layer by at least one metal bump, wherein the at least one metal bump is located between the at least one semiconductor chip and the electrically conductive layer;
   forming a metal substrate on the electrically conductive layer, wherein the metal substrate fills up a gap between the at least one semiconductor chip and the electrically conductive layer; and
   removing the temporary substrate.

2. The method according to claim 1, wherein the at least one semiconductor chip is a semiconductor optoelectronic device, and between the step of forming the metal substrate and the step of removing the temporary substrate, the method further includes:
   forming a reflective layer on the metal substrate; and
   forming a transparent protection layer on the reflective layer.

3. The method according to claim 2, wherein the step of forming the reflective layer includes using a plating method or an electroless plating method.

4. The method according to claim 1, wherein the electrically conductive layer includes a metal layer or a transparent conductive layer, a material of the metal layer includes Au, Al, Ag and Pt, and a material of the transparent conductive layer includes ITO.

5. The method according to claim 1, wherein a bottom of the at least one semiconductor chip is set with a metal adhesion layer.

6. The method according to claim 1, wherein the step of connecting the least one semiconductor chip to the electrically conductive layer by the at least one metal bump includes using an ultrasonic thermal-pressing connection method.

7. The method according to claim 1, wherein the step of connecting the least one semiconductor chip to the electrically conductive layer by the at least one metal bump includes a connection method including simultaneously using ultrasonic waves and applying pressure.

8. The method according to claim 1, wherein the step of connecting the least one semiconductor chip to the electrically conductive layer by the at least one metal bump includes using a thermal-pressing connection method.

9. The method according to claim 1, wherein the step of connecting the least one semiconductor chip to the electrically conductive layer by the at least one metal bump includes:
   connecting the at least one metal bump to the least one semiconductor chip; and
   after the step of connecting the at least one metal bump to the least one semiconductor chip, connecting the at least one metal bump to the electrically conductive layer.

10. The method according to claim 1, wherein the step of connecting the least one semiconductor chip to the electrically conductive layer by the at least one metal bump includes:
    connecting the at least one metal bump to the electrically conductive layer; and
    after the step of connecting the at least one metal bump to the electrically conductive layer, connecting the least one semiconductor chip to the at least one metal bump.

11. The method according to claim 1, wherein the at least one metal bump includes a first bump and a second bump, and the step of connecting the least one semiconductor chip to the electrically conductive layer by the at least one metal bump includes:
    connecting the first bump and the second bump to the least one semiconductor chip and the electrically conductive layer respectively; and
    after the step of connecting the first bump and the second bump to the least one semiconductor chip and the electrically conductive layer respectively, connecting the first bump to the second bump.

12. The method according to claim 1, wherein the step of forming the metal substrate includes using a plating method or an electroless plating method.

* * * * *